US012796199B2

(12) United States Patent
Kim et al.

(10) Patent No.: US 12,796,199 B2
(45) Date of Patent: Nov. 10, 2026

(54) DISPLAY DEVICE AND MANUFACTURING METHOD FOR SAME

(71) Applicant: Samsung Display Co., Ltd., Yongin-si (KR)

(72) Inventors: Eunbyul Kim, Yongin-si (KR); Hyeonji Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 360 days.

(21) Appl. No.: 18/419,132

(22) Filed: Jan. 22, 2024

(65) Prior Publication Data

US 2024/0339577 A1 Oct. 10, 2024

(30) Foreign Application Priority Data

Apr. 6, 2023 (KR) ........................ 10-2023-0045348

(51) Int. Cl.

| | |
|---|---|
| ***H10H 20/857*** | (2025.01) |
| ***H10W 90/00*** | (2026.01) |
| *H10H 20/01* | (2025.01) |

(52) U.S. Cl.

CPC .......... *H10H 20/857* (2025.01); *H10W 90/00* (2026.01); *H10H 20/0364* (2025.01)

(58) Field of Classification Search

CPC .. H10H 20/857; H10H 20/0364; H05K 3/361; H05K 1/147; G02F 1/13452; H10K 59/131; H10K 59/129; H10K 59/82

See application file for complete search history.

(56) References Cited

U.S. PATENT DOCUMENTS

| | | | |
|---|---|---|---|
| 9,295,164 | B2 | 3/2016 | Jee et al. |
| 10,268,241 | B2 | 4/2019 | Lee et al. |
| 11,163,205 | B1 | 11/2021 | Li et al. |
| 11,651,711 | B2 | 5/2023 | Seo et al. |
| 2014/0003022 | A1 | 1/2014 | Lee |
| 2014/0313439 | A1 | 10/2014 | Matsumoto |
| 2016/0218289 | A1 | 7/2016 | Lee et al. |

FOREIGN PATENT DOCUMENTS

| | | | |
|---|---|---|---|
| CN | 111725265 | A | 9/2020 |
| CN | 114863813 | A | 8/2022 |
| JP | 2000-155306 | A | 6/2000 |
| JP | 2009-157186 | A | 7/2009 |
| JP | 2014-211825 | A | 11/2014 |
| KR | 10-2016-0091526 | A | 8/2016 |
| KR | 10-2017-0098373 | A | 8/2017 |
| KR | 10-2021-0000565 | A | 1/2021 |
| KR | 10-2022-0030415 | A | 3/2022 |

OTHER PUBLICATIONS

EPO Extended European Search Report dated Sep. 4, 2024, issued in corresponding European Patent Application No. 24166122.2 (5 pages).

*Primary Examiner* — Nelson Garces

(74) *Attorney, Agent, or Firm* — Womble Bond Dickinson (US) LLP

(57) ABSTRACT

A display device includes: a display panel including: a base substrate including a display region and a non-display region; a driving chip on the non-display region; and panel pads on the non-display region, and electrically connected to the driving chip; and a circuit board electrically connected to the display panel, and including: an opening overlapping with the driving chip; connection pads located along a first direction, and overlapping with the panel pads; and holes spaced from each other in the first direction, with the connection pads located therebetween.

17 Claims, 11 Drawing Sheets

DISPLAY DEVICE AND MANUFACTURING METHOD FOR SAME

CROSS-REFERENCE TO RELATED APPLICATIONS

The present application claims priority to and the benefit of Korean Patent Application No. 10-2023-0045348, filed on Apr. 6, 2023, in the Korean Intellectual Property Office, the entire disclosure of which is incorporated by reference herein.

BACKGROUND

1. Field

Aspects of embodiments of the present disclosure relate to a display device including a display panel and a circuit board, and a manufacturing method of the display device.

2. Description of the Related Art

A multimedia apparatus, such as a television, a mobile phone, a tablet computer, a navigation system, and a game console, includes a display device for generating an image, and displays the image to a user through a display screen. The display device may include a display panel that displays the image, and a circuit board that is connected to the display panel to provide electrical signals.

The display panel and the circuit board may be electrically connected to each other through connections of pads. The display panel and the circuit board may be bonded to each other by using a thermal pressing tool. In this process, heat may be applied to components of the circuit board other than the pads, and the components of the circuit board may be damaged.

The above information disclosed in this Background section is for enhancement of understanding of the background of the present disclosure, and therefore, it may contain information that does not constitute prior art.

SUMMARY

One or more embodiments of the present disclosure are directed to a circuit board in which damage thereto that may be caused by heat during a process of bonding a display panel and the circuit board to each other may be prevented or substantially prevented.

One or more embodiments of the present disclosure are directed to a display device in which damage thereto may be prevented or substantially prevented during a process, and thus, having improved reliability.

One or more embodiments of the present disclosure are directed to a manufacturing method for the display device including the circuit board.

However, the present disclosure is not limited to the aspects and features described above, and additional aspects and features will be set forth, in part, in the description that follows, and in part, may be apparent from the description, or may be learned by practicing one or more of the presented embodiments of the present disclosure.

According to one or more embodiments of the present disclosure, a display device includes: a display panel including: a base substrate including a display region and a non-display region; a driving chip on the non-display region; and panel pads on the non-display region, and electrically connected to the driving chip; and a circuit board electrically connected to the display panel, and including: an opening overlapping with the driving chip; connection pads located along a first direction, and overlapping with the panel pads; and holes spaced from each other in the first direction, with the connection pads located therebetween.

In an embodiment, in the first direction, the holes may be more closer to outer sides of the circuit board than the connection pads.

In an embodiment, the holes may have a polygonal shape, a circular shape, or an oval shape in a plan view.

In an embodiment, the non-display region may include a bending region configured to be bent with respect to a bending axis extending in the first direction.

In an embodiment, the display device may further include a conductive adhesion member between the panel pads and the connection pads to electrically connect the panel pads and the connection pads to each other, and the conductive adhesion member may have a length extending in the first direction.

In an embodiment, ends of the conductive adhesion member may overlap with the holes, respectively.

In an embodiment, the conductive adhesion member may include: an adhesion layer including a polymer resin; and conductive particles dispersed in the adhesion layer.

In an embodiment, the panel pads may be spaced further from the display region than the driving chip in a second direction crossing the first direction.

In an embodiment, the circuit board may further include circuit lines connected to the connection pads, and some of the circuit lines may be located between an outer side of the circuit board and the holes in the first direction.

According to one or more embodiments of the present disclosure, a display device includes: a display panel including: a base substrate including a display region and a non-display region; a driving chip on the non-display region; and panel pads on the non-display region, and electrically connected to the driving chip; and a circuit board electrically connected to the display panel through a conductive adhesion member, and including: connection pads on a substrate pad region, overlapping with the panel pads, and electrically connected to the panel pads through the conductive adhesion member; and holes adjacent to outer sides of the substrate pad region. Ends of the conductive adhesion member overlap with the holes, respectively.

In an embodiment, the connection pads may be located along a first direction in the substrate pad region, and the holes may be located along the first direction with the substrate pad region therebetween.

In an embodiment, the holes may have a polygonal shape, a circular shape, or an oval shape in a plan view.

In an embodiment, the non-display region may include a bending region configured to be bent with respect to a bending axis extending in a first direction.

In an embodiment, the conductive adhesion member may include: an adhesion layer including a polymer resin; and conductive particles dispersed in the adhesion layer.

In an embodiment, the circuit board may further include circuit lines connected to the connection pads, and some of the circuit lines may be located between an outer side of the circuit board and the holes in a first direction.

In an embodiment, an opening penetrating through the circuit board may be defined in the circuit board, and the driving chip may be located in the opening.

In an embodiment, one end of the circuit board may be located between the driving chip and the display region in a plan view.

According to one or more embodiments of the present disclosure, a manufacturing method for a display device, includes: providing a display panel including a driving chip and panel pads; providing a circuit board onto the display panel, the circuit board including connection pads in a substrate pad region; disposing a conductive adhesion member between the panel pads and the connection pads; and heating and pressurizing the conductive adhesion member using a bonding device provided on the substrate pad region. Holes are defined in the circuit board to be adjacent to outer sides of the substrate pad region, and overlap with the bonding device.

In an embodiment, ends of the conductive adhesion member may overlap with the holes, respectively.

In an embodiment, the circuit board may have an opening defined therein to overlap with the driving chip.

BRIEF DESCRIPTION OF THE FIGURES

The above and other aspects and features of the present disclosure will be more clearly understood from the following detailed description of the illustrative, non-limiting embodiments with reference to the accompanying drawings, in which.

DETAILED DESCRIPTION

Figure 1:
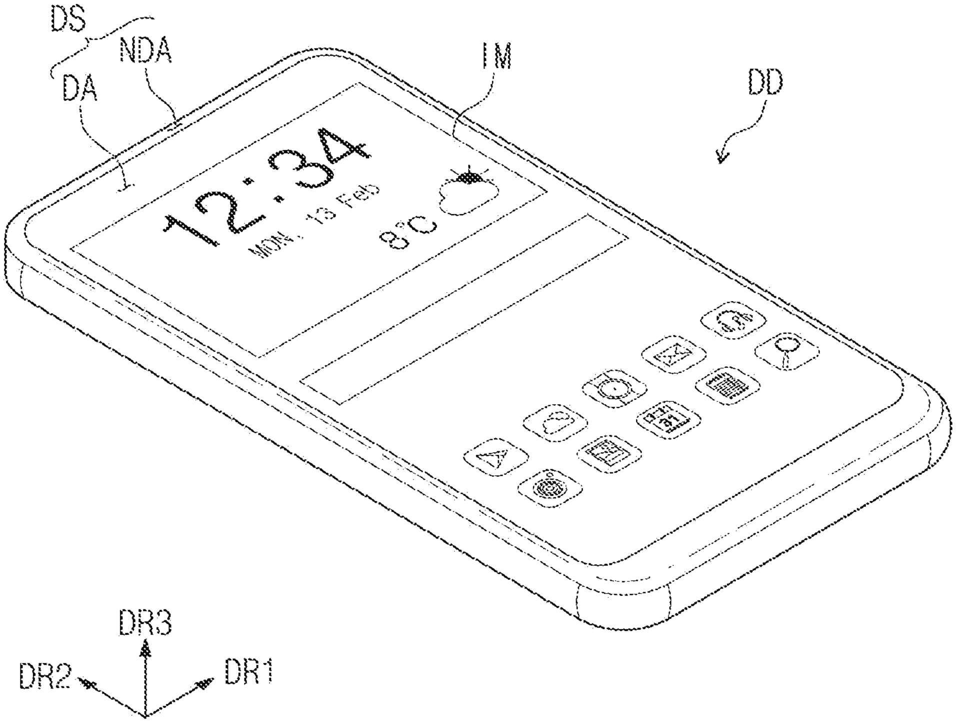
FIG. 1 is a perspective view of a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device DD according to an embodiment of the present disclosure.

Referring to FIG. 1, the display device DD may be activated in response to electrical signals, and may display an image IM. For example, the display device DD may be a large-sized device, such as a television or a billboard, or a small- or medium-sized device, such as a monitor, a mobile phone, a tablet computer, a navigation system, or a game console. However, the present disclosure is not limited thereto, and the display device may be any suitable device capable of displaying images. Hereinafter, for convenience, the display device DD may be described in more detail in the context of a mobile phone as a representative example.

The display device DD may be a rigid or flexible display device. As used herein, the term "flexible" may refer to having bending characteristics, and may include all suitable structures from a completely foldable structure to a structure bendable to a nanometer. For example, the flexible display device DD may include a curved device, a slidable device, a rollable device, or a foldable device.

The display device DD may have a rectangular shape having short sides extending in a first direction DR1, and long sides extending in a second direction DR2 crossing the first direction DR1 on a plane (e.g., in a plan view). However, the present disclosure is not limited thereto, and the display device DD may have various suitable shapes, such as a circle, a polygon other than a quadrilateral, and/or the like.

In the present embodiment, a third direction DR3 may be defined as a direction perpendicular to or substantially perpendicular to a plane defined by the first direction DR1 and the second direction DR2. A front surface (e.g., an upper surface) and a rear surface (e.g., a lower surface) of each of members constituting the display device DD may be opposite to each other in the third direction DR3, and a normal direction of each of the front surface and the rear surface may be parallel to or substantially parallel to the third direction DR3. A distance between the front surface and the rear surface defined along the third direction DR3 may correspond to a thickness of the member.

In the present specification, the expressions "on a plane" and "in a plan view" may refer to a view of an object or object portion from the third direction DR3. In the present specification, the expression "on a cross-section" and "in a cross-sectional view" may refer to a view of an object or object portion from the first direction DR1 or the second direction DR2. However, the directions indicated by the first to third directions DR1, DR2, and DR3 are relative concepts, and thus, may be modified to other suitable directions.

The display device DD may display the image IM through a display surface DS. The display surface DS may correspond to the front surface of the display device DD. The display surface DS of the display device DD may include a flat or substantially flat surface defined by the first direction DR1 and the second direction DR2, and may display the image IM in the third direction DR3 crossing the flat or substantially flat surface. However, the present disclosure is not limited thereto, and the display surface DS may further include at least one curved surface that is bent from at least one side of the flat or substantially flat surface.

The display surface DS of the display device DD may include a display part DA and a non-display part NDA. The display part DA may be a region where the image IM is displayed in the display surface DS. The image IM may be displayed through the display part DA in the third direction DR3. The image IM may include a still image and/or a dynamic image, and FIG. 1 illustrates a clock and various icons as representative examples of the image IM.

The non-display part NDA may be a region that is adjacent to the display part DA, and no images may be displayed in the non-display part NDA of the display surface DS. The non-display part NDA may be a region having a lower light transmittance than that of the display part DA. In an embodiment, the non-display part NDA may surround (e.g., around a periphery of) the display part DA, and may define the shape of the display part DA. However, the present disclosure is not limited thereto, and the non-display part NDA may be disposed in only one side of the display part DA, or may be omitted as needed or desired.

The display device DD according to an embodiment may detect an external input applied from the outside. The external input may include various suitable kinds of inputs. For example, the external input may include power, pressure, temperature, light, or the like. The external input may include an input applied in close proximity to the display device DD (e.g., hovering), as well as an input applied by contact with the display device DD (e.g., contact by a user's hand or pen).

Figure 2:
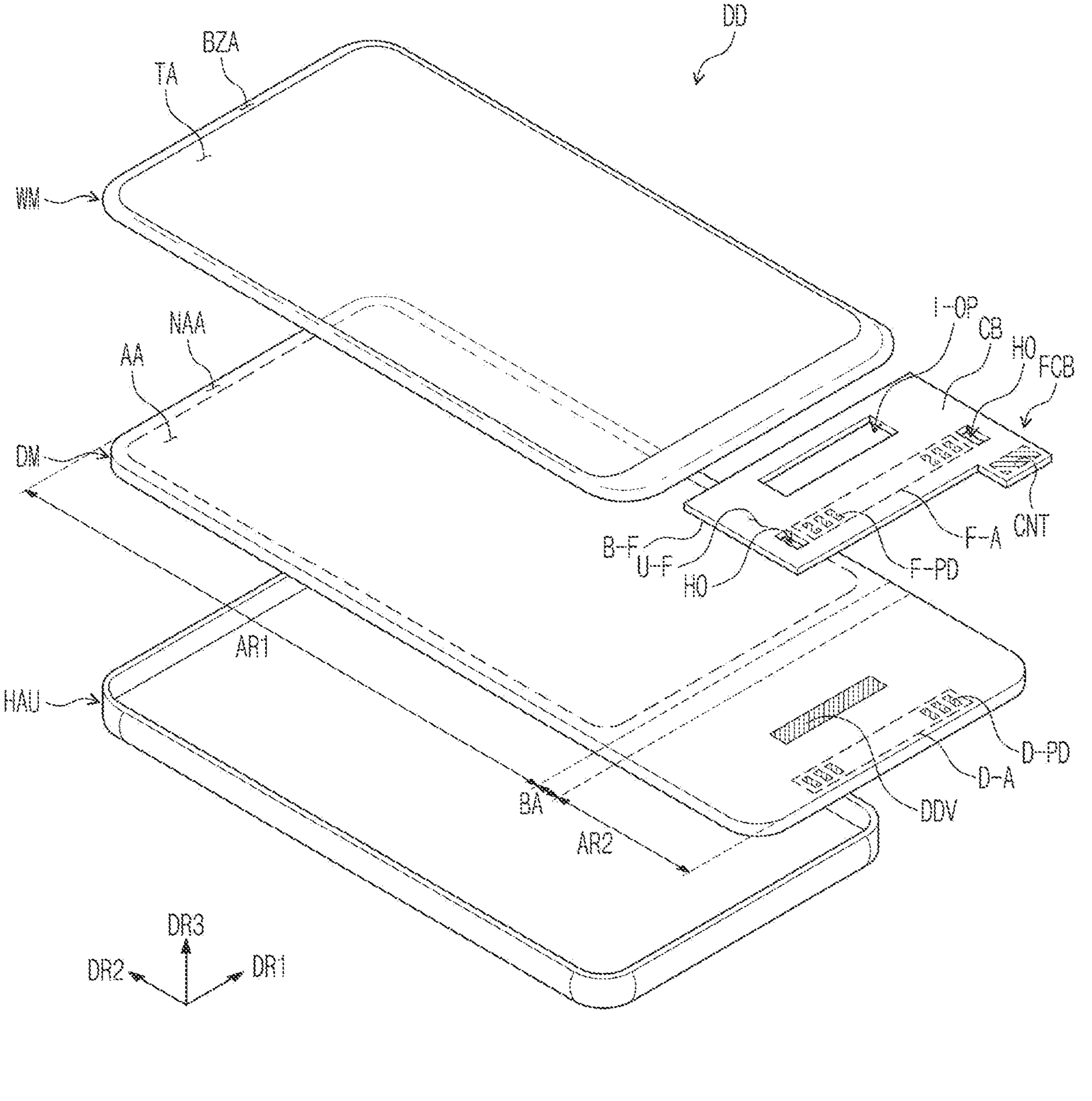
FIG. 2 is an exploded perspective view of a display device according to an embodiment of the present disclosure.
Figure 3:
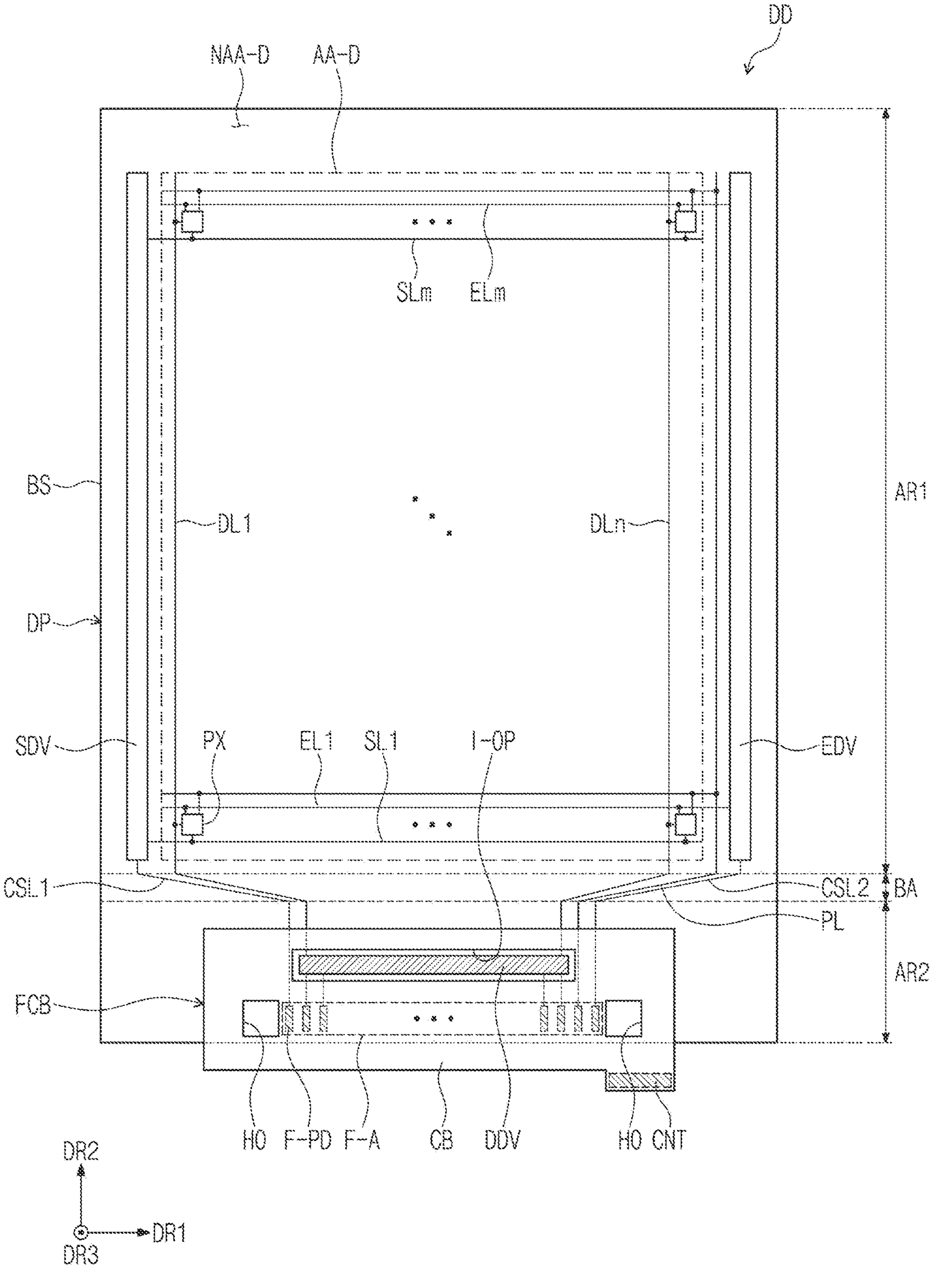
FIG. 3 is a plan view illustrating a partial configuration of a display device according to an embodiment of the present disclosure.

FIG. 2 is an exploded perspective view of the display device DD according to an embodiment of the present disclosure. FIG. 3 is a plan view illustrating a partial configuration of the display device DD according to an embodiment of the present disclosure.

Referring to FIG. 2, the display device DD may include a window WM, a display module (e.g., a display or a touch-display) DM, and a housing HAU. However, the composition of the display device DD is not limited to that illustrated, and the display device DD may further include a functional layer, such as an anti-reflection layer, disposed between the display module DM and the window WM, and/or an electronic module (e.g., an electronic device or sensor), such as a camera module (e.g., a camera) and a battery module (e.g., a battery), disposed between the display module DM and the housing HAU.

The window WM may be disposed on the display module DM. The window WM may cover the front surface of the display module DM, and may protect the display module DM from external impacts and scratches. The window WM may be bonded to the display module DM through an adhesive layer.

The window WM may include an optically-transparent insulation material. For example, the window WM may include a glass film or a synthetic resin film as a base film. The window WM may further include a functional layer, such as an anti-fingerprint layer, a phase control layer, and/or a hard-coating layer, disposed on the base film.

The front surface of the window WM may correspond to the front surface of the display device DD. The front surface of the window WM may include a transmission region TA and a bezel region BZA.

The transmission region TA may be an optically-transparent region. The transmission region TA may transmit an image provided by the display module DM, and a user may view the image through the transmission region TA. In the present embodiment, the transmission region TA is illustrated as having a quadrilateral shape, but the transmission region TA may have various suitable shapes, and thus, is not limited to any one embodiment.

The bezel region BZA may be adjacent to the transmission region TA. The shape of the transmission region TA may be defined by or substantially by the bezel region BZA. For example, the bezel region BZA may be disposed in the outer side of the transmission region TA, and may surround (e.g., around a periphery of) the transmission region TA. However, the present disclosure is not limited thereto, and the bezel region BZA may be adjacent to only one side of the transmission region TA, or may be disposed on a side surface different from (e.g., not on) the front surface of the display device DD.

The bezel region BZA may be a region having a lower light transmittance than that of the transmission region TA. The bezel region BZA may correspond to a region printed with a suitable material having a suitable color (e.g., a predetermined color). The bezel region BZA may prevent or substantially prevent light transmission, and may prevent or substantially prevent components of the display module DM, which are disposed to overlap with the bezel region BZA, from being visible from the outside.

The display module DM may be disposed between the window WM and the housing HAU. The display module DM may include an active region AA and a peripheral region NAA.

The active region AA of the display module DM may be activated in response to electrical signals, and may overlap with at least a portion of the transmission region TA. The active region AA may correspond to a display region AA-D (e.g., see FIG. 3) of a display panel DP described in more detail below.

The peripheral region NAA of the display module DM may be adjacent to the active region AA. For example, the peripheral region NAA may surround (e.g., around a periphery of) the active region AA. However, the present disclosure is not limited thereto, and the peripheral region NAA may be defined in various suitable forms. The peripheral region NAA may be a region where a driving circuit, a signal line, pads, and the like, for driving an element disposed in the active region AA, are disposed. The peripheral region NAA may correspond to a non-display region NAA-D (e.g., see FIG. 3) of the display panel DP described in more detail below.

The peripheral region NAA may overlap with at least a portion of the bezel region BZA. The bezel region BZA may prevent or substantially prevent a component disposed in the peripheral region NAA from being visible from the outside.

The display module DM may include the display panel DP (e.g., see FIG. 3). FIG. 3 illustrates an example of a plan view of the display panel DP included in the display module DM.

Referring to FIG. 3, the display panel DP may generate an image in response to electrical signals. The display panel DP according to an embodiment may be an emission-type display panel, but is not particularly limited thereto. For example, the display panel DP may be an organic light-emitting display panel, an inorganic light-emitting display panel, or a quantum-dot light-emitting display panel. A light-emitting layer of the organic light-emitting display panel may include an organic light-emitting material, a light-emitting layer of the inorganic light-emitting display panel may include an inorganic light-emitting material, and a light-emitting layer of the quantum-dot light-emitting display panel may include quantum dots, quantum rods, and/or the like.

The display panel DP may include a base substrate BS, pixels PX, signal lines SL1 to SLm, DL1 to DLn, EL1 to Elm, CSL1, CSL2, and PL electrically connected to the pixels PX, a scan driver SDV, a data driver DDV, an emission driver EDV, and panel pads D-PD (e.g., see FIG. 2).

The base substrate BS may provide a base surface where the elements and the lines of the display panel DP are disposed on a flat or substantially flat surface parallel to or substantially parallel to each of the first direction DR1 and the second direction DR2. The base substrate BS may include the display region AA-D and the non-display region NAA-D of the display panel DP.

The display region AA-D may be a region where the pixels PX are disposed to display an image. The non-display region NAA-D may be a region that is adjacent to the display region AA-D, and in which an image is not displayed. In the non-display region NAA-D, the scan driver SDV, the data driver DDV, the emission driver EDV, and the like for driving the pixels PX may be disposed. However, the present disclosure is not limited thereto, and at least one of the scan driver SDV, the data driver DDV, or the emission driver EDV may be disposed in the display region AA-D in order to reduce the area (e.g., the size) of the non-display region NAA-D.

The pixels PX may each include a pixel drive circuit composed of transistors (e.g., a switching transistor, a driving transistor, and the like) and at least one capacitor, and a light-emitting element electrically connected to the pixel drive circuit. The pixels PX may emit light in response to electrical signals applied to the pixels PX, and may display an image on the display region AA-D.

Referring to FIGS. 2 and 3, the display module DM and the display panel DP may include a first region AR1, a second region AR2, and a bending region BA. The first region AR1, the bending region BA, and the second region AR2 may be arranged along the second direction DR2. The first region AR1 may extend from one side of the bending region BA, and the second region AR2 may extend from another side (e.g., opposite to the one side) of the bending region BA. The first region AR1 and the second region AR2 may be spaced apart from each other with the bending region BA therebetween.

The display region AA-D of the display panel DP (e.g., the active region AA of the display module DM) may be defined in the first region AR1. The remaining region of the first region AR1, except for the display region AA-D (e.g., active region AA), may be defined as the non-display region NAA-D (e.g., the peripheral region NAA).

The bending region BA may extend from the first region AR1, and the second region AR2 may extend from the bending region BA toward a direction opposite to the first region AR1. The bending region BA and the second region AR2 may be defined as the non-display region NAA-D (e.g., the peripheral region NAA).

The bending region BA may be bendable with respect to a bending axis BX (e.g., see FIG. 5A) parallel to or substantially parallel to the first direction DR1. For example, the bending region BA may be bent toward the rear surface of the first region AR1 of the display panel DP. When the bending region BA is bent, the second region AR2 extending from the other side of the bending region BA may overlap with the first region AR1 on a plane (e.g., in a plan view). In other words, the second region AR2 may be disposed on the rear surface of the display panel DP corresponding to the first region AR1.

FIGS. 2 and 3 illustrate that the width of the bending region BA is equal to or substantially equal to the width of the first region AR1 in the first direction DR1 parallel to or substantially parallel to the bending axis BX (e.g., see FIG. 5A), but the present disclosure is not limited thereto. For example, the width of the bending region BA may be smaller than the width of the first region AR1 in the first direction DR1, and accordingly, the bending region BA may be more easily bendable.

Referring to FIG. 3, the signal lines SL1 to SLm, DL1 to DLn, EL1 to Elm, CS1, CSL2, and PL of the display panel DP may include scan lines SL1 to SLm, data lines DL1 to DLn, emission lines EL1 to Elm, first and second control lines CSL1 and CSL2, and a power line PL. Here, m and n are natural numbers greater than or equal to 1.

The pixels PX may each be electrically connected to a corresponding scan line, a corresponding data line, and a corresponding emission line from among the scan lines SL1 to SLm, the data lines DL1 to DLn, and the emission lines EL1 to Elm. More kinds of signal lines may be included in the display panel DP according to a desired configuration of the pixel drive circuits of the pixels PX.

The data lines DL1 to DLn may cross the scan lines SL1 to SLm and the emission lines EL1 to Elm on a plane (e.g., in a plan view) while being insulated therefrom. For example, the scan lines SL1 to SLm may extend in the first direction DR1 to be electrically connected to the scan driver SDV. The data lines DL1 to DLn may extend in the second direction DR2 to be electrically connected to the data driver DDV. The emission lines EL1 to Elm may extend in the first direction DR1 to be electrically connected to the emission driver EDV.

The power line PL may include a portion extending in the first direction DR1 and a portion extending in the second direction DR2. The portion of the power line PL extending in the second direction DR2 may be disposed on the non-display region NAA-D. The portion of the power line PL extending in the first direction DR1 may be electrically connected to the pixels PX and the portion of the power line PL extending in the second direction DR2. In an embodiment, the portion of the power line PL extending in the first direction DR1 may be disposed at (e.g., in or on) a layer different from that of the portion extending in the second direction DR2, and thus, may be connected to the portion extending in the second direction DR2 through a contact hole. In an embodiment, the portion of the power line PL extending in the first direction DR1 may be disposed at (e.g., in or on) the same layer as that of the portion extending in the second direction DR2, and thus, may have an integral shape with the portion extending in the second direction DR2.

The first control line CSL1 may be electrically connected to the scan driver SDV. The second control line CSL2 may be electrically connected to the emission driver EDV.

The data driver DDV may include a data drive circuit for driving the pixels PX. The data driver DDV may be provided as an integrated circuit chip that is defined as a driving chip, and mounted on the non-display region NAA-D of the display panel DP. For example, the data driver DDV may be mounted on the second region AR2 of the non-display region NAA-D. However, the present disclosure is not limited thereto, and the data driver DDV may be mounted on a circuit board FCB electrically connected to the display panel DP. As another example, the data drive circuit of the data driver DDV may be formed through the same or substantially the same process as the process of forming the transistors of the pixels PX. Hereinafter, an embodiment in which the data driver DDV is provided as a driving chip will be mainly described in more detail, and the driving chip DDV is denoted with the same reference symbol as that of the data driver DDV.

The scan driver SDV may generate scan signals in response to scan control signals. The scan signals may be applied to the pixels PX through the scan lines SL1 to SLm. The driving chip DDV may generate data voltages corresponding to image signals in response to data control signals. The data voltages may be applied to the pixels PX through the data lines DL1 to DLn. The emission driver EDV may generate emission signals in response to emission control signals. The emission signals may be applied to the pixels PX through the emission lines EL1 to Elm.

The pixels PX may receive the data voltages in response to the scan signals. The pixels PX may emit light having a brightness corresponding to the data voltages in response to the emission signals, and thus, may generate an image in the display region AA-D. The emission time of the pixels PX may be controlled by the emission signals.

Referring to FIGS. 2 and 3, panel pads D-PD may be disposed to be adjacent to a lower end of the second region AR2. The panel pads D-PD may be disposed to be more closer to the lower end of the display panel DP than (e.g., compared to) the driving chip DDV. The panel pads D-PD may be disposed to be spaced apart from each other along the first direction DR1. A region where the panel pads D-PD are disposed on the second region AR2 may be defined as a panel pad region D-A.

The panel pads D-PD may be electrically connected to the pixels PX. The panel pads D-PD may each be connected to a corresponding signal line from among the signal lines SL1 to SLm, DL1 to DLn, EL1 to Elm, CSL1, CSL2, and PL. For example, the panel pads D-PD may be electrically connected to the power line PL, the first control line CSL1, the second control line CSL2, and the data lines DL1 to DLn, respectively. The signal lines connected to the panel pads D-DP and the driving chip DDV (e.g., the power line PL, the first control line CSL1, the second control line CSL2, and the data lines DL1 to DLn) may extend from the first region AR1 toward the second region AR2 via the bending region BA.

The panel pads D-DP may be portions where the circuit board FCB for providing signals for controlling operations of the scan driver SDV, the driving chip DDV, and the emission driver EDV of the display panel DP is electrically connected.

The circuit board FCB may be disposed on the non-display region NAA-D. The circuit board FCB may be disposed on the second region AR2 of the non-display region NAA-D. The circuit board FCB may be disposed on the display panel DP, and may be electrically connected to the panel pads D-DP. The circuit board FCB may generate electrical signals to provide the electrical signals to the display panel DP, or may receive and process signals generated from the display panel DP. The circuit board FCB may be connected to a main circuit board involved in the operations of various electronic modules of the display device DD.

The circuit board FCB may include a base film CB and connection pads F-PD. The base film CB may be a flexible film having flexibility, and the circuit board FCB may be a flexible circuit board. However, the present disclosure is not limited thereto.

The base film CB may include a first surface U-F and a second surface B-F. The second surface B-F may face the front surface of the second region AR2 of the display panel DP. The first surface U-F may be opposite to the second surface B-F, and may be exposed to the outside in the third direction DR3 on the front surface of the display panel DP. The first surface U-F may correspond to the front surface of the base film CB, and the second surface B-F may correspond to the rear surface of the base film CB.

The connection pads F-PD may be disposed on the second surface B-F of the base film CB. The connection pads F-PD may be disposed to be spaced apart from each other along the first direction DR1. A region where the connection pads F-PD are disposed on the base film CB may be defined as a substrate pad region F-A. The connection pads F-PD may be disposed to overlap with the panel pads D-PD, respectively. The connection pads F-PD may be electrically connected to the panel pads D-PD.

An opening I-OP passing through (e.g., penetrating) the circuit board FCB may be defined in the circuit board FCB. The opening I-OP may overlap with the driving chip DDV on a plane (e.g., in a plan view). The planar area of the opening I-OP may be substantially equal to or greater than the planar area of the driving chip DDV. On a plane (e.g., in a plan view), the entire region of the driving chip DDV may be exposed by the opening I-OP.

Because the opening I-OP overlapping with the driving chip DDV is defined in the circuit board FCB, the circuit board FCB may be disposed to be flat or substantially flat on the second region AR2 of the display panel DP where the driving chip DDV is disposed. On a plane (e.g., in a plan view), an end of the circuit board FCB parallel to or substantially parallel to the first direction DR1 may be disposed above the driving chip DDV. Accordingly, on a plane (e.g., in a plan view), the area of the circuit board FCB occupying on the outer side of the display panel DP may be minimized or reduced.

Holes HO passing through (e.g., penetrating) the circuit board FCB may be defined in the circuit board FCB. The holes HO may overlap with the second region AR2 of the display panel DP on a plane (e.g., in a plan view). The holes HO may be disposed to be adjacent to opposite sides (e.g., both sides) of the substrate pad region F-A, respectively, in the first direction DR1. For example, the holes HO may each be disposed to be more closer to an outer side of the circuit board FCB than (e.g., compared to) a corresponding connection pad F-PD disposed on the outermost side in the substrate pad region F-A. The connection pads F-PD may be arranged between the holes HO disposed along the first direction DR1.

Because the holes HO are defined in the outer sides of the substrate pad region F-A in the first direction DR1 in the circuit board FCB, it may be possible to prevent or substantially prevent damage to the components of the circuit board FCB during a process of bonding the circuit board FCB onto the display panel DP without deterioration in a bonding reliability. This will be described in more detail below.

The circuit board FCB may further include a connector CNT. The connector CNT may be electrically connected to the connection pads F-PD. The connector CNT may be a connection terminal that is connected to the main circuit board. The circuit board FCB may be electrically connected to the main circuit board through the connector CNT. FIGS. 2 and 3 illustrate that the connector CNT is disposed on a protruding portion of the circuit board FCB on a plane (e.g., in a plan view) as a representative example, but the location in which the connector CNT is disposed is not limited to that illustrated.

The window WM and the housing HAU may be connected to (e.g., coupled to or attached to) each other, and may form the exterior of the display device DD. The display module DM may be accommodated in an inner space formed by the window WM and the housing HAU that are coupled to each other. As the bending region BA of the display module DM is bent, the circuit board FCB disposed on the second region AR2 may be positioned on the rear surface of the first region AR1, and thus, may be accommodated in the housing HAU.

The housing HAU may include a suitable material having a relatively high rigidity. For example, the housing HAU may include a frame and/or a plate containing glass, plastic, or a metal, or a suitable combination thereof. The housing HAU may absorb impacts applied from the outside, or may prevent or substantially prevent foreign substances, moisture, and/or the like from penetrating from the outside, and thus, may protect the display module DM accommodated in the housing HAU.

Figure 4:
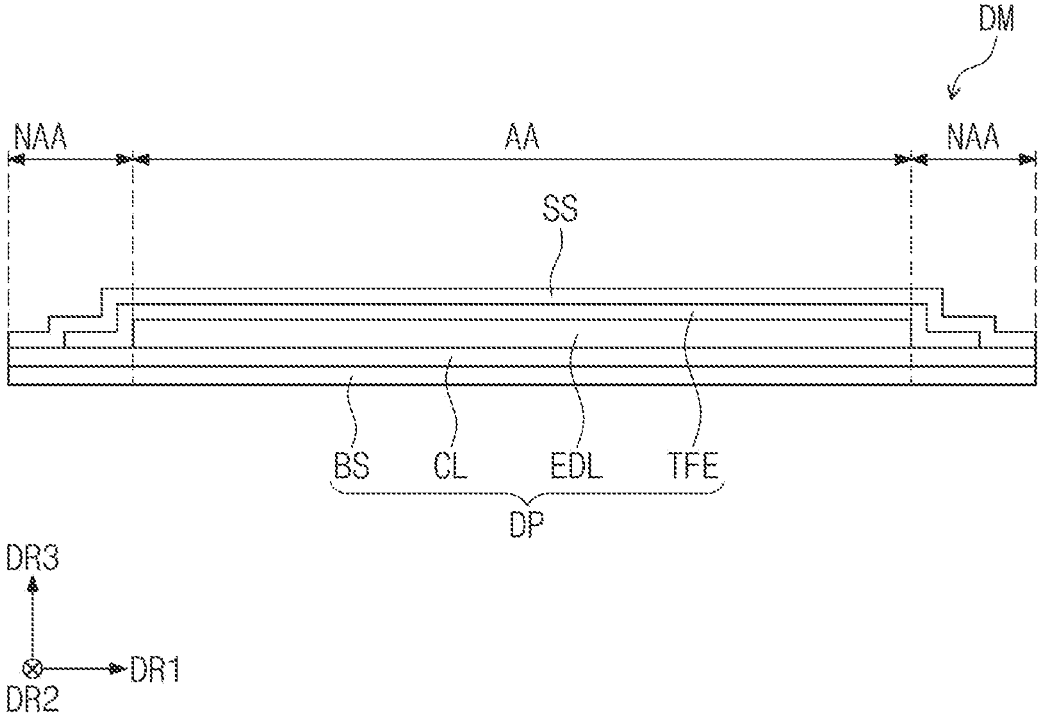
FIG. 4 is a cross-sectional view of a display module according to an embodiment of the present disclosure.

FIG. 4 is a cross-sectional view of the display module DM according to an embodiment of the present disclosure.

Referring to FIG. 4, the display module DM may include the display panel DP and a sensor layer SS. The display panel DP may include the base substrate BS, a circuit layer CL, a display element layer EDL, and an encapsulation layer TFE.

The base substrate BS may provide a base surface on which the circuit layer CL is disposed. The base substrate BS may be a rigid substrate, or a flexible substrate capable of bending, folding, rolling, or the like. The base substrate BS may be a glass substrate, a metal substrate, a polymer substrate, or the like. However, the present disclosure is not limited thereto, and the base substrate BS may include an inorganic layer, a synthetic resin layer, or a composite material layer.

The base substrate BS may have a multi-layered structure. For example, the base substrate BS may include synthetic resin layers, and a single-layer or multi-layered inorganic layer disposed between the synthetic resin layers. The synthetic resin layers may include an acrylate-based resin, a methacrylate-based resin, polyisoprene, a vinyl-based resin, an epoxy-based resin, a urethane-based resin, a cellulose-based resin, a siloxane-based resin, a polyamide-based resin, a perylene-based resin, and/or the like, but the material of the synthetic resin layers is not limited thereto.

The circuit layer CL may be disposed on the base substrate BS. The circuit layer CL may include at least one insulation layer, a semiconductor pattern, and a conductive pattern. The insulation layer, a semiconductor layer, and a conductive layer may be formed through coating, deposition, and/or the like, and then the insulation layer, the semiconductor layer, and the conductive layer may be patterned through multiple cycles of photolithography to form the insulation layer, the semiconductor pattern, and the conductive pattern of the circuit layer CL. The insulation layer, the semiconductor pattern, and the conductive pattern included in the circuit layer CL may form driving elements, such as a transistor, signal lines, and panel pads in the circuit layer CL.

The display element layer EDL may be disposed on the circuit layer CL. The display element layer EDL may include light-emitting elements disposed in an active region AA. The light-emitting elements of the display element layer EDL may be electrically connected to the driving elements of the circuit layer CL, and may generate light in the active region AA in response to signals provided by the driving elements.

The encapsulation layer TFE may be disposed on the display element layer EDL, and may seal the light-emitting elements. The encapsulation layer TFE may include at least one thin film in order to improve an optical efficiency of the display element layer EDL, or to protect the display element layer EDL. The encapsulation layer TFE may include at least one of an inorganic film or an organic film.

The sensor layer SS may be disposed on the display panel DP. The sensor layer SS may be formed on the display panel DP through a continuous process. In this case, the sensor layer SS may be directly disposed on the display panel DP without a separate adhesive layer. However, the present disclosure is not limited thereto, and the sensor layer SS may be bonded onto the display panel DP through an adhesive layer.

The sensor layer SS may include at least one of an input sensor, an antenna sensor, or a fingerprint sensor. For example, the sensor layer SS may include the input sensor, and the input sensor may detect an external input to provide an input signal including information on the external input, so that the display panel DP may generate an image corresponding to the external input. The input sensor may be operated in various suitable ways, such as a capacitive method, a resistive method, an infrared method, a sound wave method, or a pressure method, but is not limited to any one embodiment.

The composition of the display module DM is not limited to that illustrated, and a protection member disposed under the display panel DP and/or an anti-reflection layer disposed above the display panel DP may be further included.

In an embodiment, the protection member may be disposed on the rear surface of the display panel DP, and thus, may protect the display panel DP from external impacts. The protection member may include a layer, such as a cushion layer, that absorbs impacts, a heat dissipation layer that prevents or substantially prevents a heat transfer to the display panel DP, or a shielding layer that blocks light reflection or electromagnetic waves.

In an embodiment, the anti-reflection layer may be disposed on the sensor layer SS. The anti-reflection layer may be disposed on the sensor layer SS through a continuous process without an adhesive layer. However, the present disclosure is not limited thereto, and the anti-reflection layer may be bonded onto the sensor layer SS through an adhesive layer. In addition, the location at which the anti-reflection layer is stacked may be between the display panel DP and the sensor layer SS.

The anti-reflection layer may include various suitable embodiments for reducing the reflectance of external light incident from the outside of the display device DD (e.g., see FIG. 1). For example, the anti-reflection layer may include a polarizing film having a retarder and/or a polarizer, multi-layered reflective layers that destructively interfere with reflected light, or color filters disposed to correspond to the arrangements and light-emitting colors of the pixels PX (e.g., see FIG. 3).

Figure 5A:
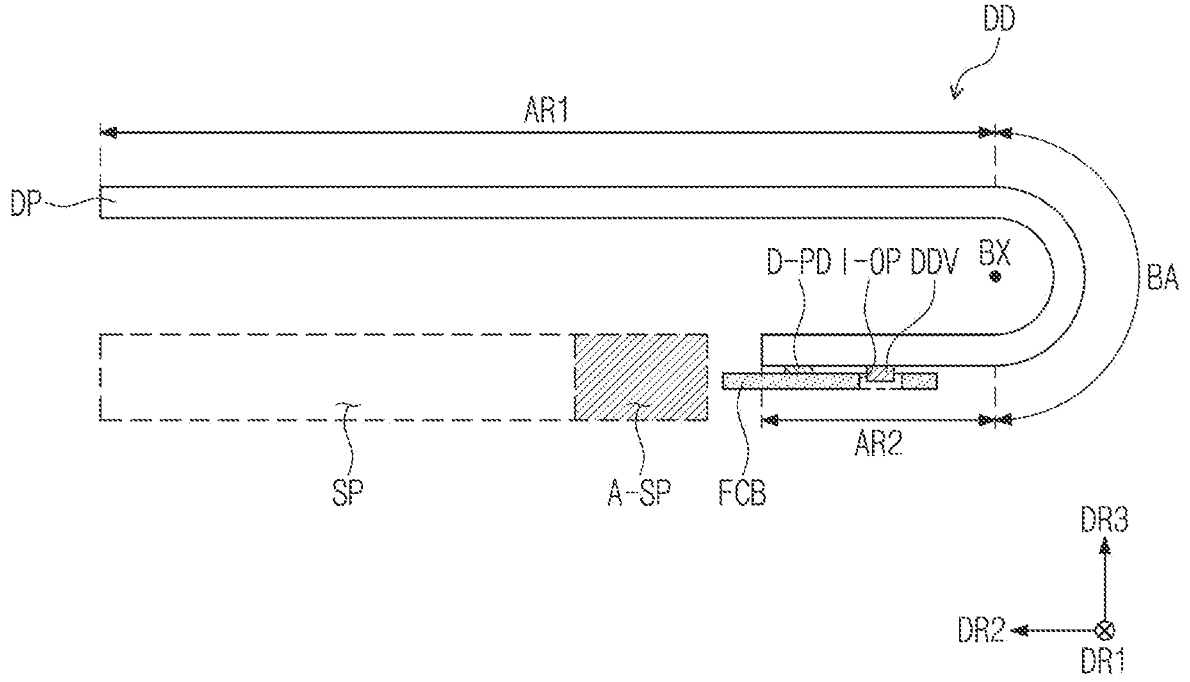
FIG. 5A is a cross-sectional view of a display device according to an embodiment of the present disclosure.
Figure 5B:
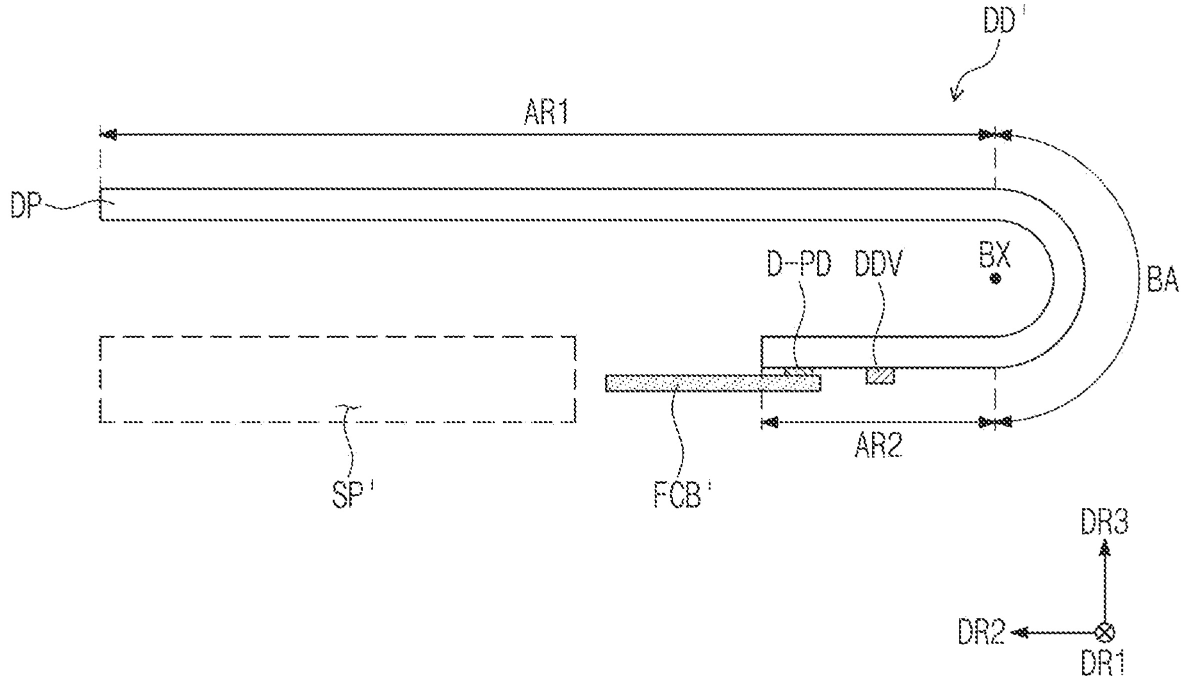
FIG. 5B is a cross-sectional view of a display device according to a comparative example.

FIG. 5A is a cross-sectional view of the display device DD according to an embodiment of the present disclosure. FIG. 5B is a cross-sectional view of a display device DD' according to a comparative example.

Referring to FIG. 5A, the display device DD may include the display panel DP and the circuit board FCB. For example, the display panel DP and the circuit board FCB may be the same or substantially the same as those described above, and thus, redundant description thereof may not be repeated.

The bending region BA of the display panel DP may be bendable with respect to a bending axis BX extending in a first direction DR1. The bending region BA may be bent with a suitable curvature (e.g., a predetermined curvature). As the bending region BA is bent, the first region AR1 and the second region AR2 may overlap with each other in the third direction DR3.

The driving chip DDV and The panel pad D-PD may be disposed on the second region AR2. The panel pad D-PD may be disposed more closer to the lower end of the second region AR, which is spaced apart from the bending region BA, than (e.g., compared to) the driving chip DDV.

The circuit board FCB may be disposed on the second region AR2. The circuit board FCB may be electrically connected to the panel pad D-PD. The opening I-OP overlapping with the driving chip DDV may be defined in the circuit board FCB, and thus, may be disposed to surround (e.g., around a periphery of) the driving chip DDV. One end of the circuit board FCB parallel to or substantially parallel to the first direction DR1 may be more closer to the bending region BA than (e.g., compared to) the driving chip DDV.

A space (e.g., a predetermined space) SP may exist on the rear surface of the first region AR1 of the display panel DP. The space SP may be formed on the same plane as that of the second region AR2 and the circuit board FCB. In the space SP, a functional electronic module constituting the display device DD, such as the battery module, the camera module, and/or a sensor module (e.g., a sensor), may be disposed.

Another end of the circuit board FCB parallel to or substantially parallel to the first direction DR1 may be protrude more in the second direction DR2 than (e.g., compared to) the lower end of the second region AR2. The lower end of the second region AR2 may overlap with the circuit board FCB on a plane (e.g., in a plan view). The size of the space SP may change according to the distance from the lower end of the second region AR2 to another end of the circuit board FCB.

Because the opening I-OP is defined in the circuit board FCB, the circuit board FCB may be disposed to extend to a region where the driving chip DDV is disposed. Accordingly, the circuit board FCB may be disposed, such that the distance from the lower end of the second region AR2 to another end of the circuit board FCB is minimized or reduced, and the space SP where the electronic module is disposed may be sufficiently secured.

Referring to FIG. 5B, the display device DD' according to the comparative example may include a display panel DP, and a circuit board FCB'. The display panel DP may be the same or substantially the same as the display panel DP described above with reference to FIG. 5A, and thus, redundant description thereof may not be repeated.

One end of the circuit board FCB' according to the comparative example may be disposed to be adjacent to a panel pad D-PD and a lower end of the second region AR2. The circuit board FCB' according to the comparative example may be disposed to be spaced apart from the driving chip DDV on a plane (e.g., in a plan view). The one end of the circuit board FCB' according to the comparative example that is parallel to or substantially parallel to the first direction DR1 may be disposed farther from the bending region BA than (e.g., compared to) the driving chip DDV. For example, the one end of the circuit board FCB' according to the comparative example may be positioned between the panel pad D-PD and the driving chip DDV on a plane (e.g., in a plan view).

The circuit board FCB' may be have a minimum area for the lines and the elements to be disposed in the circuit board FCB'. Therefore, because the circuit board FCB' is disposed more closer to the lower end of the second region AR2 than the driving chip DDV, the distance from the lower end of the second region AR2 to another end of the circuit board FCB' according to the comparative example may be further extended than the distance in the case of the circuit board FCB according to the embodiment illustrated in FIG. 5A.

When the circuit boards FCB and FCB' have the same area as each other, the area of the circuit board FCB according to the embodiment in FIG. 5A occupying on a plane (e.g., in a plan view) may be smaller than the area of the circuit board FCB' according to the comparative example in FIG. 5B. In other words, the space SP' where the electronic module is to be disposed may be reduced by the area of a region where the circuit board FCB' is disposed on the rear surface of the first region AR1.

On the other hand, because the circuit board FCB according to an embodiment is disposed to surround (e.g., around a periphery of) the driving chip DDV on the second region AR2, the space on a plane (e.g., in a plan view) for the circuit board FCB to be disposed may be reduced. Accordingly, an additional space A-SP may be secured in the display device DD, unlike the display device DD' according to the comparative example. Because the additional space A-SP, where the electronic module is disposed, is formed in the display device DD, restrictions on where the electronic module can be disposed may be reduced, and without expansion in the size of the display device DD, it may be possible to accommodate the electronic module having a relatively large volume or area.

Figure 6A:
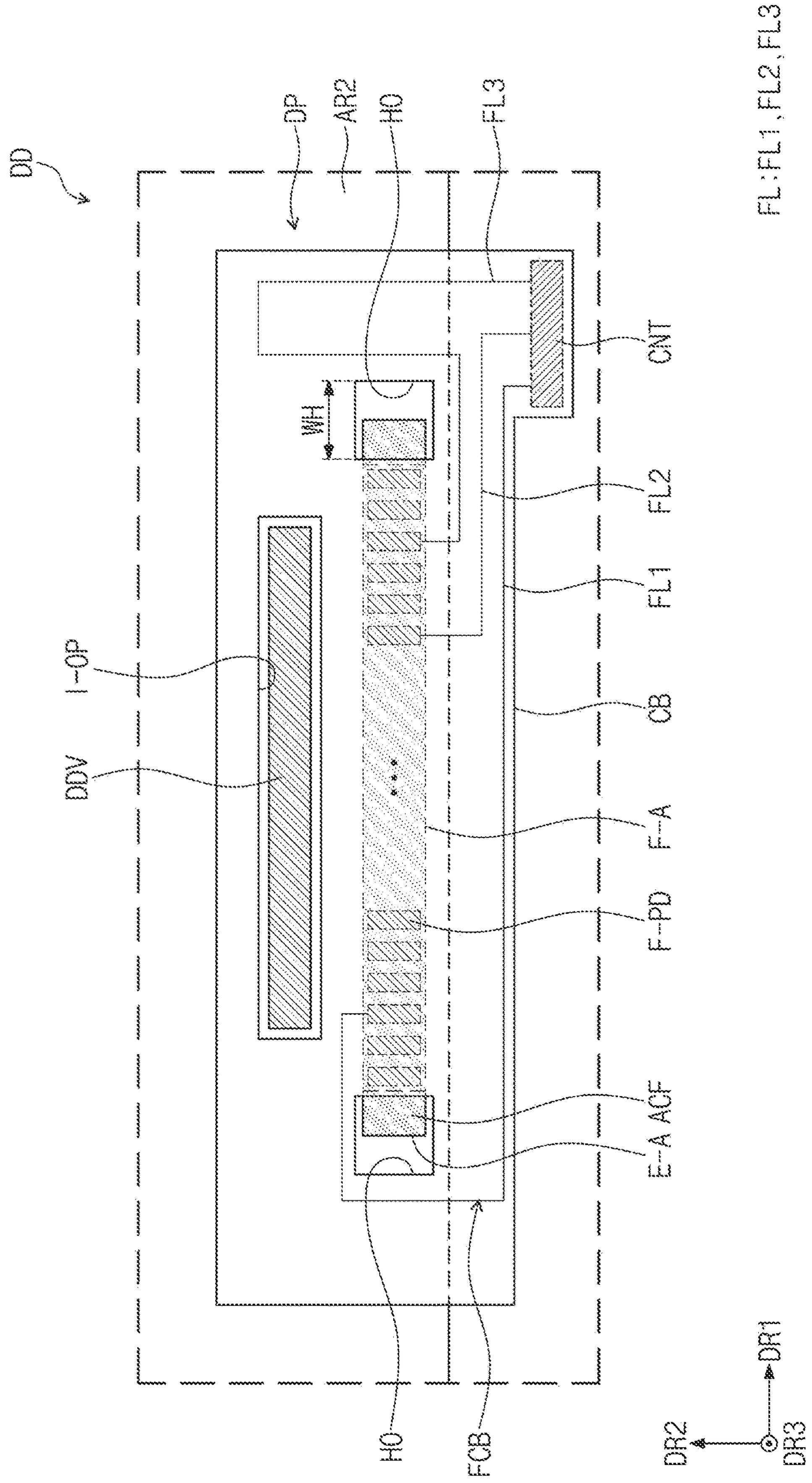
FIG. 6A is an enlarged plan view of a portion of a display device according to an embodiment of the present disclosure.
Figure 6B:
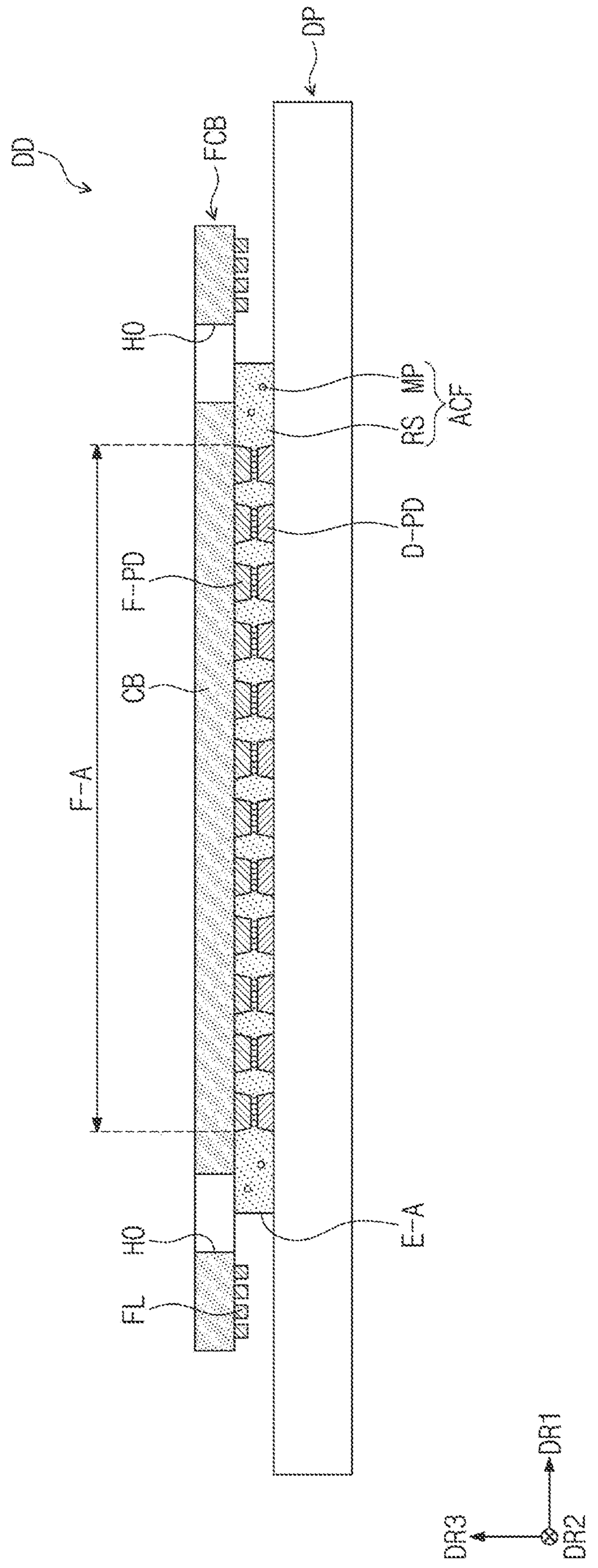
FIG. 6B is a cross-sectional view of a display device according to an embodiment of the present disclosure.
Figure 7:
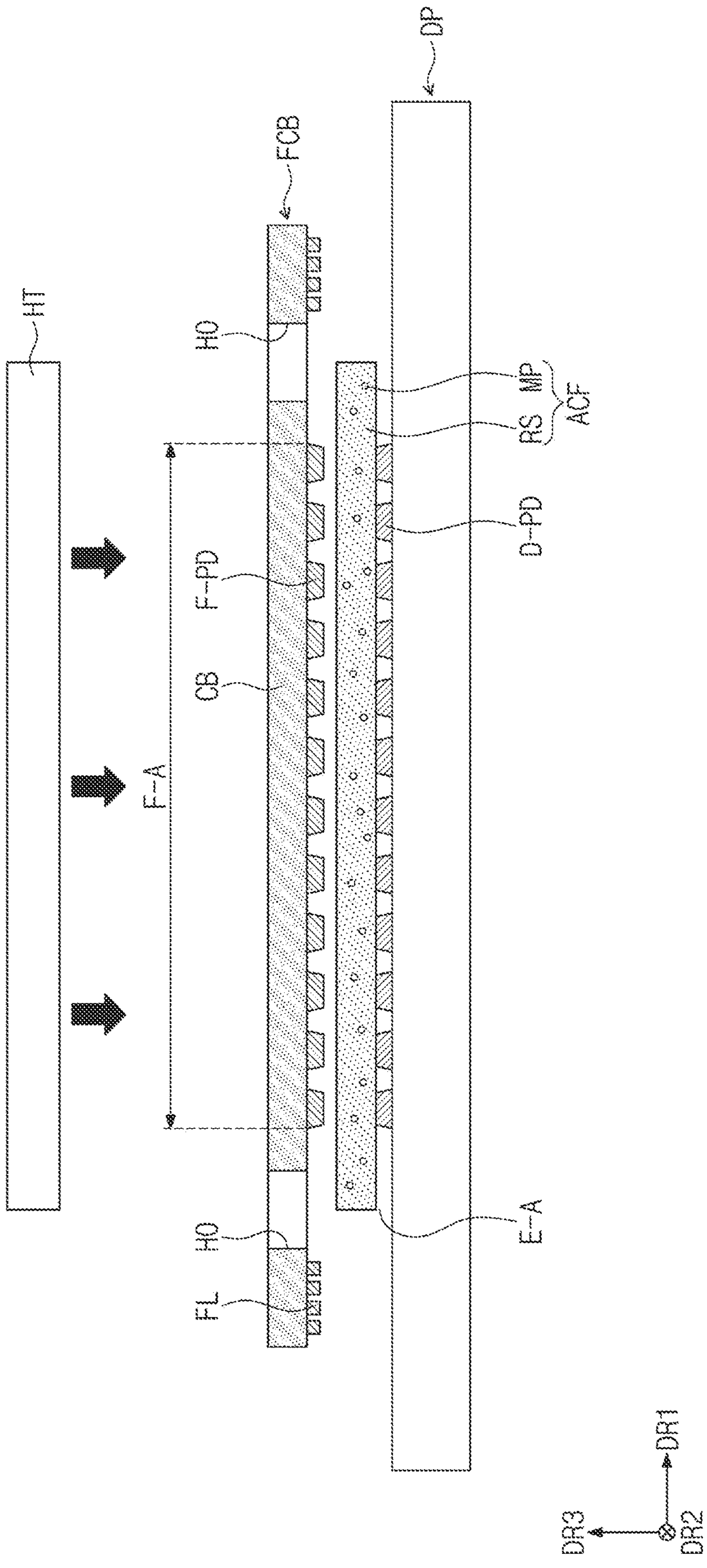
FIG. 7 is a cross-sectional view illustrating an operation of a manufacturing method for a display device according to an embodiment of the present disclosure.

FIG. 6A is an enlarged plan view of a portion of the display device DD according to an embodiment of the present disclosure. FIG. 6B is a cross-sectional view of the display device DD according to an embodiment of the present disclosure. FIG. 7 is a cross-sectional view illustrating an operation of a manufacturing method for the display device DD according to an embodiment of the present disclosure.

The manufacturing method for the display device DD according to an embodiment of the present disclosure may include bonding a display panel DP to a circuit board FCB. FIG. 7 illustrates an operation in the bonding of the display panel DP to the circuit board FCB, and FIGS. 6A and 6B illustrate a plan view and a cross-sectional view, respectively, of the display panel DP and the circuit board FCB that are bonded to each other.

Referring to FIGS. 6A and 6B, the display device DD may include the display panel DP, and the circuit board FCB disposed on the display panel DP. The display panel DP and the circuit board FCB may be the same or substantially the same as those described above, and thus, redundant description thereof may not be repeated.

The opening I-OP passing through the circuit board FCB may be defined in the circuit board FCB. The opening I-OP may overlap with the driving chip DDV on a plane (e.g., in a plan view). The driving chip DDV may be exposed from the circuit board FCB through the opening I-OP. The base film CB of the circuit board FCB may surround (e.g., around a periphery of) the driving chip DDV on a plane (e.g., in a plan view), and may be disposed on the second region AR2 of the display panel DP.

The circuit board FCB may include circuit lines FL (e.g., FL1, FL2, and FL3) for electrically connecting the connector CNT to the connection pads F-PD. The circuit lines FL may each extend from the connector CNT, and may each be connected to a corresponding connection pad F-PD.

Because the opening I-OP is defined in the circuit board FCB, a region where the circuit lines FL (e.g., FL1, FL2, and FL3) are disposed may be limited. Some circuit lines FL2 from among the circuit lines FL (e.g., FL1, FL2, and FL3) may be disposed on a region between the connector CNT and the substrate pad region F-A, but due to the limited region, other circuit lines FL1 and FL3 from among the circuit lines FL (e.g., FL1, FL2, and FL3) may be disposed in a detour to a region adjacent to outer sides of the base film CB. For example, some circuit lines FL1 from among the circuit lines FL (e.g., FL1, FL2, and FL3) may be disposed in a detour to a region between the left end of the base film CB and the substrate pad region F-A. Other circuit lines FL3 from among the circuit lines FL (e.g., FL1, FL2, and FL3) may be disposed in a detour to a region between the right end of the base film CB and the substrate pad region F-A.

However, the layout of the circuit lines FL (e.g., FL1, FL2, and FL3) is not limited to the embodiment illustrated in FIG. 6A.

Referring to FIGS. 6A, 6B, and 7, the manufacturing method for the display device DD according to an embodiment may include providing a display panel DP, and providing a circuit board FCB onto the display panel DP so that the panel pads D-PD overlap with the connection pads F-PD, and the driving chip DDV overlaps with the opening I-OP. The manufacturing method may further include disposing a conductive adhesion member ACF between the panel pads D-PD and the connection pads F-PD, aligning a bonding device HT on the substrate pad region F-A where the connection pads F-PD are disposed, and pressurizing and heating by using the bonding device HT.

The conductive adhesion member ACF may be provided between the connection pads F-PD of the circuit board FCB and the panel pads D-PD of the display panel DP. The conductive adhesion member ACF may be disposed on the second surface B-F (e.g., see FIG. 2) of the base film CB and on the connection pads F-PD.

The conductive adhesion member ACF may have a conductivity and an adhesiveness at the same time. Accordingly, the conductive adhesion member ACF may bond the circuit board FCB and the display panel DP to each other physically and electrically. For example, the conductive adhesion member ACF may include an anisotropic conductive adhesive film. The conductive adhesion member ACF may include an adhesion layer RS and conductive particles MP.

The adhesion layer RS may overlap with the panel pads D-PD and the connection pads F-PD. The adhesion layer RS may overlap with the substrate pad region F-A, and may be disposed to extend outward from the substrate pad region F-A in the first direction DR1. Ends of the adhesion layer RS may correspond to ends E-A of the conductive adhesion member ACF. The ends of the adhesion layer RS may overlap with the holes HO, and may be exposed from the circuit board FCB through the holes HO, respectively.

The panel pads D-PD and the connection pads F-PD may be physically bonded to each other through the adhesion layer RS. Because the adhesion layer RS is disposed to extend outward from the substrate pad region F-A, the display panel DP and the circuit board FCB may be stably bonded to each other.

The adhesion layer RS may include a polymer material. For example, the adhesion layer RS may include at least one of an acrylate-based polymer, a silicon-based polymer, a urethane-based polymer, or an imide-based polymer. The adhesion layer RS may be formed by thermally curing or photocuring a polymer resin.

The conductive particles MP may be dispersed in the adhesion layer RS. The conductive particles MP may be aligned between the panel pads D-PD and the connection pads F-PD corresponding to each other in the adhesion layer RS. In the process of bonding the circuit board FCB to the display panel DP, the conductive particles MP may have anisotropy, so that current flows in the pressing direction through pressurizing. For example, a direction of the current flowing through the conductive particles MP may be parallel to the pressing direction, and the current may not flow in a direction crossing the pressing direction. Accordingly, the panel pads D-PD and the connection pads F-PD may be electrically bonded to each other by the conductive particles MP disposed between the panel pads D-PD and the connection pads F-PD. In addition, a short may be prevented or substantially prevented from occurring between the panel pads D-PD adjacent to the first direction DR1 or the connection pads F-PD adjacent to the first direction DR1.

The conductive particles MP may be metal particles, alloy particles mixed with multiple metals, or the like. For example, the conductive particles MP may be metal or metal alloy particles containing at least one of silver, copper, bismuth, zinc, indium, tin, nickel, cobalt, chrome, or iron. As another example, the conductive particles MP may each have a core part formed of a polymer resin and/or the like, and a coating layer made of a conductive material surrounding (e.g., around a periphery of) the core part.

In order to bond the connection pads F-PD to the panel pads D-PD through the conductive adhesion member ACF, heat and pressure may be applied onto the substrate pad region F-A using the bonding device HT. In a bonding process using the conductive adhesion member ACF, a high temperature condition may be desired. For example, in order to adhere the conductive adhesion member ACF to the display panel DP and the circuit board FCB, a high temperature of at least about 150° C. may be desired, for example, such as a temperature of at least about 200° C.

In order to bond the panel pads D-PD and the connection pads F-PD together using the conductive adhesion member ACF, the bonding device HT may apply heat onto the entire region of the substrate pad region F-A. The bonding device HT may be designed to extend further in the first direction DR1 than the substrate pad region F-A, so that misalignment on the substrate pad region F-A may be corrected, and sufficient heat may be transferred to the entire region of the substrate pad region F-A. Because the bonding device HT is designed to extend farther, a space for compensating for heat loss may be secured.

However, because a region where the bonding device HT is provided extends farther than the substrate pad region F-A, circuit lines disposed adjacent to the outer sides of the substrate pad region F-A may also be heated and pressurized. Accordingly, the circuit line disposed adjacent to the outer side of the substrate pad region F-A may have cracks occurring therein, or may be damaged due to the heat.

In order to prevent or substantially prevent the damage on the circuit lines FL disposed adjacent to the outer sides of the substrate pad region F-A, the circuit board FCB according to an embodiment of the present disclosure may have the holes HO passing through the circuit board FCB. The holes HO may be disposed on left and right sides of the substrate pad region F-A, respectively. The holes HO may each be disposed adjacent to a corresponding connection pad F-PD disposed in the outermost side in the first direction DR1 from among the connection pads F-PD disposed in the substrate pad region F-A. In other words, the holes HO may be disposed to be spaced apart from each other in the first direction DR1, and the connection pads F-PD may be disposed between the holes HO.

The bonding device HT, which is designed to extend further than the substrate pad region F-A, may overlap the holes HO. By the holes HO defined adjacent to the outer sides of the substrate pad region F-A, heat transfer to the outer sides of the substrate pad region F-A may be prevented.

The holes HO may be formed in a region overlapping with the bonding device HT. The widths WH of the holes HO in the first direction DR1 may be designed in consideration of the size of the bonding device HT. For example, the width WH of each of the holes HO may be at least about 1 millimeter (mm), and may be several millimeters (mm).

Because the holes HO are defined to be adjacent to the left and right sides of the substrate pad region F-A, respectively, in the circuit board FCB, the circuit lines FL may be designed to be arranged in a detour around the holes HO. In other words, the circuit lines FL disposed adjacent to the left and right sides of the substrate pad region F-A may be disposed to be spaced apart from the holes HO on a plane (e.g., in a plan view). Accordingly, the length of the line overlapping with the bonding device HT from among the circuit lines FL disposed adjacent to the left and right sides of the substrate pad region F-A may be minimized or reduced, thereby, preventing or substantially preventing the circuit lines FL from being damaged in the pressurizing and heating by the bonding device HT.

The conductive adhesion member ACF may be disposed corresponding to a region where the panel pads D-PD and the connection pads F-PD, which are electrically connected to each other through the conductive adhesion member ACF, are disposed, or in other words, the panel pad region D-A and the substrate pad region F-A. The conductive adhesion member ACF may be in contact with each of the panel pads D-PD and the connection pads F-PD, and thus, may electrically connect the panel pads D-PD and the connection pads F-PD to each other.

The conductive adhesion member ACF may be provided to have the length extending along the first direction DR1, so as to overlap with the connection pads F-PD arranged along the first direction DR1. The length of the conductive adhesion member ACF in the first direction DR1 may be larger than or equal to the width of the substrate pad region F-A in the first direction DR1. In other words, the conductive adhesion member ACF may be disposed to extend farther than the outer side of the substrate pad region F-A. Accordingly, the conductive adhesion member ACF may completely cover the connection pads F-PD on a plane (e.g., in a plan view). As such, in the process of bonding the connection pads F-PD and the panel pads D-PD to each other through the conductive adhesion member ACF, it may be possible to prevent or substantially prevent some of the pads from being disconnected due to, for example, a process error, and connection reliability of the display panel DP and the circuit board FCB may be improved.

Because the conductive adhesion member ACF is disposed to extend farther than the substrate pad region F-A in a direction parallel to or substantially parallel to the first direction DR1, the ends E-A of the conductive adhesion member ACF may be exposed by the holes HO, respectively. Portions adjacent to the respective ends E-A of the conductive adhesion member ACF may also be exposed from the circuit board FCB through the holes HO, respectively.

If the holes HO are not defined in the circuit board FCB, the ends E-A of the conductive adhesion member ACF may be covered by the base film CB. Accordingly, it may be difficult to check with the naked eye whether or not the conductive adhesion member ACF is disposed and bonded at the correct position, and a separate monitoring device may be additionally used, so that the manufacturing and inspection processes of the display device DD may become complicated.

However, according to one or more embodiments of the present disclosure, because the holes HO are defined in the circuit board FCB, in the manufacturing process of the display device DD, the ends E-A of the conductive adhesion member ACF may be visible from the outside through the holes HO. Therefore, without the use of the separate additional monitoring, it may be possible to check with the naked eye, through the holes HO, whether or not the conductive adhesion member ACF is disposed at the correct position. Accordingly, a process reliability of the display device DD may be improved, and it may be possible to monitor whether or not the conductive adhesion member ACF is correctly disposed in a simplified manner.

Because the holes HO adjacent to the left and right sides of the substrate pad region F-A are defined in the circuit board FCB according to one or more embodiments of the present disclosure, it may be possible to prevent or substantially prevent damage on the circuit lines FL in the process of bonding the circuit board FCB to the display panel DP physically and electrically, thereby, improving the reliability of the display device DD. In addition, the arrangement of the conductive adhesion member ACF may be monitored through the holes HO, and thus, the reliability of the bonding process may be improved.

FIG. 6A illustrates that each of the holes HO has a quadrilateral shape on a plane (e.g., in a plan view) as a representative example, but the present disclosure is not limited thereto, and the holes HO may have various suitable shapes on a plane (e.g., in a plan view). As long as the holes HO are disposed to be adjacent to the outer sides of the substrate pad region F-A, and disposed to overlap with the ends E-A of the conductive adhesion member ACF, the shape of the holes HO is not particularly limited to any one embodiment. Various examples of suitable shapes of the holes HO are illustrated in FIGS. 8A through 8C.

Figure 8A:
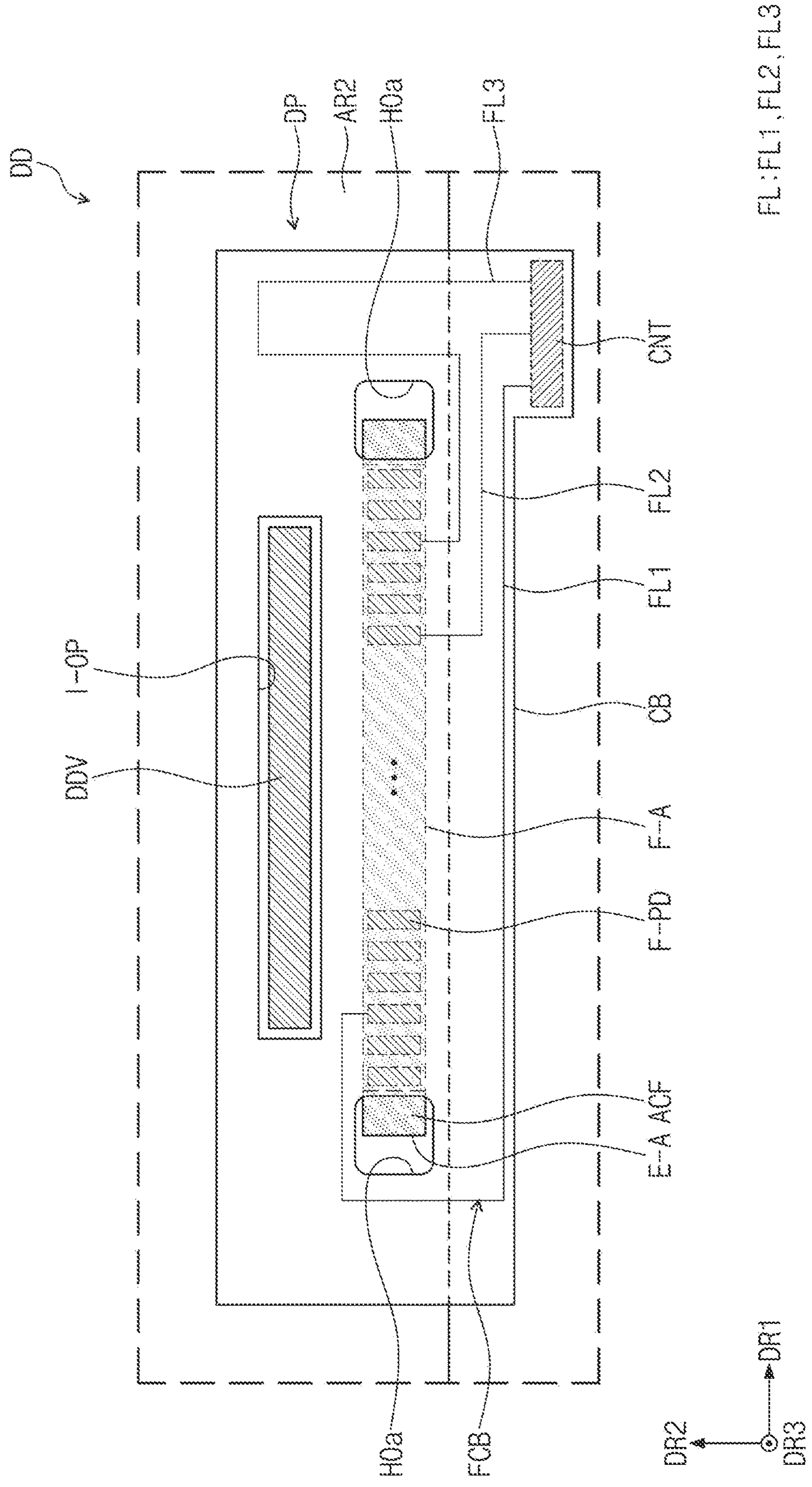
FIGS. 8A through 8C are plan views of a portion of a display device according to embodiments of the present disclosure.
Figure 8B:
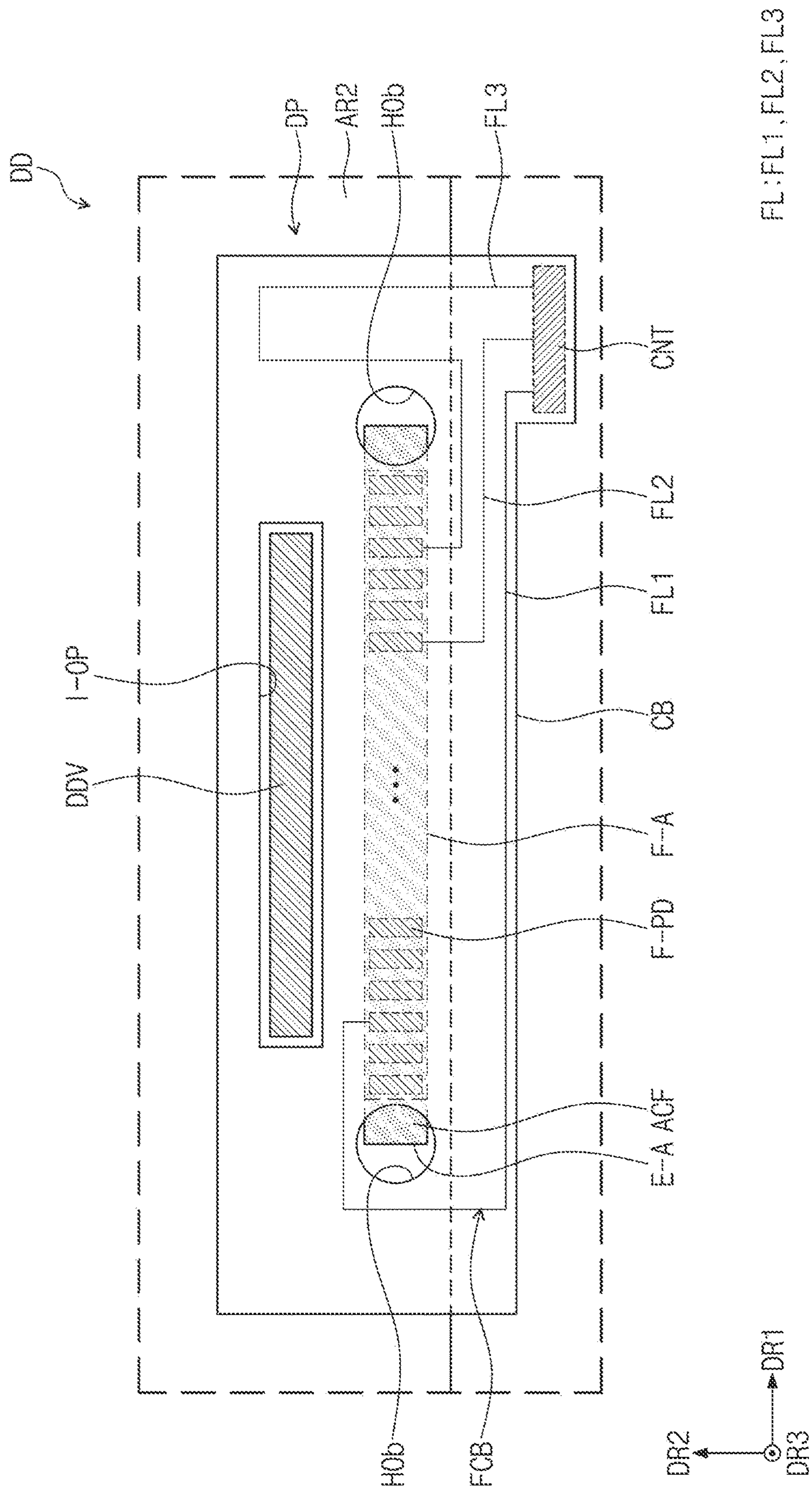
Figure 8C:
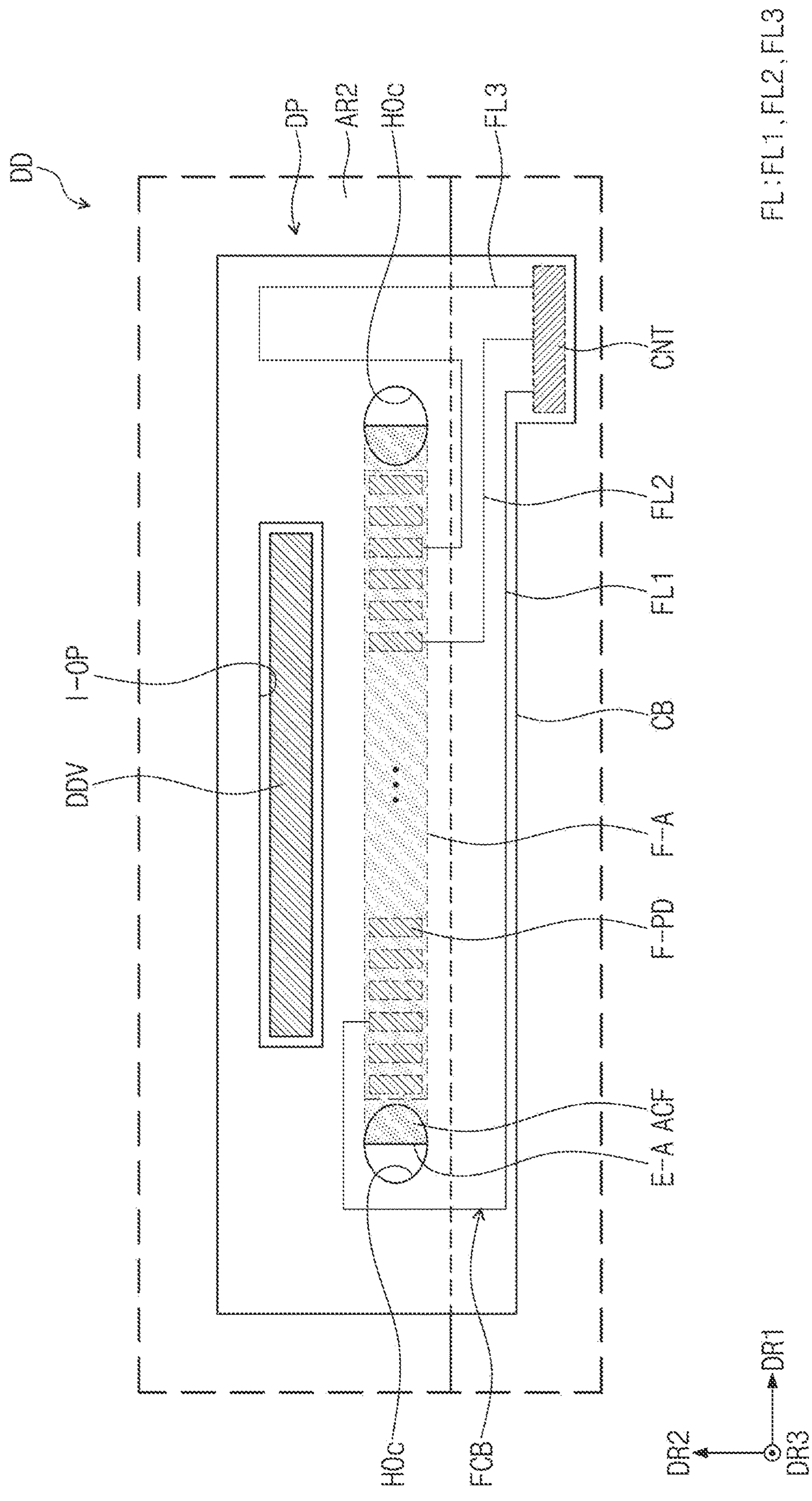

FIGS. 8A through 8C are plan views of a portion of a display device DD according to embodiments of the present disclosure. The display devices DD illustrated in FIGS. 8A through 8C are the same or substantially the same as the display device DD described above, except that the shape of the holes HO may be different, and thus, redundant description may not be repeated and the differences may be mainly described in more detail hereinafter.

Referring to FIG. 8A, the holes HOa may each have a quadrilateral shape with rounded corners on a plane (e.g., in a plan view). However, the present disclosure is not limited thereto, and the holes HOa may have a typical polygonal shape, other than the quadrilateral shape, and the corners of the polygon may be rounded.

Referring to FIG. 8B, the holes HOb may each have a circular shape on a plane (e.g., in a plan view). The diameter of each of the holes HOb may correspond to the width of each of the holes HOb, and may be designed in consideration of the size of the bonding device HT (e.g., see FIG. 7). For example, the diameter of each of the holes HOb may be at least 1 millimeter (mm), and may be several millimeters (mm).

Referring to FIG. 8C, the holes HOc may each have an oval shape on a plane (e.g., in a plan view). The holes HOc may have the oval shape extending in the first direction DR1. The length of the long axis of each of the holes HOc may correspond to the width of each of the holes HOc, and may be designed in consideration of the size of the bonding device HT (e.g., see FIG. 7).

According to one or more embodiments of the present disclosure, the circuit board may include the holes defined in the outer sides of the connection pads in correspondence to a region where the bonding device is provided. The bonding device may extend in a direction in which the connection pads are arranged in order to secure a space for compensating for heat loss, and the holes may prevent or substantially prevent heat transfer due to the bonding device to the circuit lines disposed in a detour around the outer sides of the connection pads. Accordingly, the circuit lines may be prevented or substantially prevented from being damaged.

According to one or more embodiments of the present disclosure, the circuit board may include the holes defined in the outer sides of the connection pads, and by the holes, ends of the conductive adhesion member, which is in contact with the circuit board, may be exposed. Accordingly, the position of the conductive adhesion member may be monitored, and process reliability of the display device may be improved.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a display panel comprising:
a base substrate comprising a display region and a non-display region;
a driving chip on the non-display region; and
panel pads on the non-display region, and electrically connected to the driving chip; and
a circuit board electrically connected to the display panel, and comprising:
an opening overlapping with the driving chip;
connection pads located along a first direction, and overlapping with the panel pads; and
holes spaced from each other in the first direction, with the connection pads located therebetween.

2. The display device of claim 1, wherein, in the first direction, the holes are more closer to outer sides of the circuit board than the connection pads.

3. The display device of claim 1, wherein the holes have a polygonal shape, a circular shape, or an oval shape in a plan view.

4. The display device of claim 1, wherein the non-display region comprises a bending region configured to be bent with respect to a bending axis extending in the first direction.

5. The display device of claim 1, further comprising a conductive adhesion member between the panel pads and the connection pads to electrically connect the panel pads and the connection pads to each other,
wherein the conductive adhesion member has a length extending in the first direction.

6. The display device of claim 5, wherein ends of the conductive adhesion member overlap with the holes, respectively.

7. The display device of claim 5, wherein the conductive adhesion member comprises:
an adhesion layer comprising a polymer resin; and
conductive particles dispersed in the adhesion layer.

8. The display device of claim 1, wherein the panel pads are spaced further from the display region than the driving chip in a second direction crossing the first direction.

9. The display device of claim 1, wherein the circuit board further comprises circuit lines connected to the connection pads, and
wherein some of the circuit lines are located between an outer side of the circuit board and the holes in the first direction.

10. A display device comprising:
a display panel comprising:
a base substrate comprising a display region and a non-display region;
a driving chip on the non-display region; and
panel pads on the non-display region, and electrically connected to the driving chip; and
a circuit board electrically connected to the display panel through a conductive adhesion member, and comprising:
connection pads on a substrate pad region, overlapping with the panel pads, and electrically connected to the panel pads through the conductive adhesion member; and
holes adjacent to outer sides of the substrate pad region,
wherein ends of the conductive adhesion member overlap with the holes, respectively.

11. The display device of claim 10, wherein the connection pads are located along a first direction in the substrate pad region, and
wherein the holes are located along the first direction with the substrate pad region therebetween.

12. The display device of claim 10, wherein the holes have a polygonal shape, a circular shape, or an oval shape in a plan view.

13. The display device of claim 10, wherein the non-display region comprises a bending region configured to be bent with respect to a bending axis extending in a first direction.

14. The display device of claim 10, wherein the conductive adhesion member comprises:
an adhesion layer comprising a polymer resin; and
conductive particles dispersed in the adhesion layer.

15. The display device of claim 10, wherein the circuit board further comprises circuit lines connected to the connection pads, and
wherein some of the circuit lines are located between an outer side of the circuit board and the holes in a first direction.

16. The display device of claim 10, wherein an opening penetrating through the circuit board is defined in the circuit board, and the driving chip is located in the opening.

17. The display device of claim 16, wherein one end of the circuit board is located between the driving chip and the display region in a plan view.

* * * * *